United States Patent
Self

(10) Patent No.: US 7,276,977 B2
(45) Date of Patent: Oct. 2, 2007

(54) CIRCUITS AND METHODS FOR REDUCING STATIC PHASE OFFSET USING COMMUTATING PHASE DETECTORS

(76) Inventor: Paul William Ronald Self, 3368 Creighton Pl., Santa Clara, CA (US) 95051

(*) Notice: Subject to any disclaimer, the term of this patent is extended or adjusted under 35 U.S.C. 154(b) by 0 days.

(21) Appl. No.: 11/200,472

(22) Filed: Aug. 9, 2005

(65) Prior Publication Data

US 2007/0035348 A1 Feb. 15, 2007

(51) Int. Cl.
*H03L 7/07* (2006.01)
*H03L 7/87* (2006.01)

(52) U.S. Cl. .................... 331/11; 331/17; 331/44; 327/157

(58) Field of Classification Search ............ 331/11, 331/44, 17; 327/236, 157; 702/106
See application file for complete search history.

(56) References Cited

U.S. PATENT DOCUMENTS

| | | | |
|---|---|---|---|
| 5,166,641 A | 11/1992 | Davis et al. | |
| 6,043,715 A | 3/2000 | Bailey et al. | |
| 6,222,421 B1 | 4/2001 | Kiyose | |
| 6,608,511 B1 | 8/2003 | Hsu | |
| 6,768,359 B2 | 7/2004 | Hsu | |
| 6,768,955 B2 | 7/2004 | Gauthier et al. | |
| 6,788,045 B2 | 9/2004 | Gauthier et al. | |
| 6,850,102 B2 | 2/2005 | Hsu et al. | |
| 7,020,793 B1* | 3/2006 | Hsieh | 713/401 |
| 7,061,290 B2* | 6/2006 | Hasegawa | 327/157 |

OTHER PUBLICATIONS

"ICL7600/ICL7601 High Reliability Commutating Auto-Zero(CAZ) Operational Amplifier", Intersil datasheet.
Peter Bradshaw, "The ICL7650S: A New Era in Glitch-Free Chopper Stabilized Amplifiers", Intersil datasheet, Jul. 2001, Application Note 053.

* cited by examiner

*Primary Examiner*—Benny Lee
*Assistant Examiner*—James Goodley
(74) *Attorney, Agent, or Firm*—Fountainhead Law Group P.C.; Chad R. Walsh

(57) ABSTRACT

Embodiments of the present invention reduce static phase offset in timing loops. In one embodiment, the present invention includes a timing loop comprising first and second phase detectors, wherein during a first time period, the first phase detector is coupled in a closed timing loop and the second phase detector is decoupled from the closed timing loop and calibrated, and during a second time period, the second phase detector is coupled in a closed timing loop and the first phase detector is decoupled from the closed timing loop and calibrated.

56 Claims, 10 Drawing Sheets

CIRCUITS AND METHODS FOR REDUCING STATIC PHASE OFFSET USING COMMUTATING PHASE DETECTORS

BACKGROUND

The present invention relates to reducing static phase offset in timing loops, and in particular, to circuits and methods of reducing static phase offset using commutating phase detectors.

Timing loops are circuits that are used in a wide variety of electronic applications. Timing loops are typically used to generate signals that have particular frequencies, periods, or delays. Such loops include phase locked loops and delay locked loops, for example. FIG. 1A illustrates a phase locked loop architecture, which is one type of timing loop. Phase locked loop ("PLL") 100A includes a phase detector 110, loop filter 120, voltage controlled oscillator ("VCO") 130, and may optionally include feedback 140 such as a divider, for example. Phase detector 110 includes two input terminals and an output terminal. The first input terminal receives a reference frequency ("REF"), which may be a digital or analog signal. The second input terminal of phase detector 110 is a feedback signal ("FB") coupled to the output of VCO 130. Phase detector 110 translates phase differences between the input signals into an output signal. The output of phase detector 110 may be a current into a capacitance in loop filter 120, for example. The output of loop filter 120 is a voltage that controls the frequency of oscillation of VCO 130. The output frequency generated by VCO 130 may be divided by feedback 140 or coupled directly to the feedback input of phase detector 110.

As mentioned above, timing loops are used in a variety of applications. For example, in the design of computer systems, maintaining adequate timing margin between the computer system's clock signal and data is very important. As the frequency of the system clock increases, maintaining adequate timing margin becomes even more difficult. Thus, the design of clock distribution networks for the computer becomes more and more difficult as frequencies increase. One application of a timing loop is a zero delay buffer ("ZDB"), which is shown in FIG. 1B. In ZDB 100B, the output of the VCO is typically fed back directly to the input of the phase detector. In this example, the phase detector is implemented using a phase frequency detector and a charge pump. A ZDB may be used to improve the performance of the clock distribution network in a computer system. A ZDB may be used to regenerate a clock signal to improve drive capability or to regenerate multiple copies of the system clock. An ideal ZDB has an output that is an identical version of the input signal in phase and frequency (e.g., the divider modulus of the feedback shown in FIG. 1A is equal to one). Since the output signal of an ideal ZDB is exactly in phase with the input signal, there would appear to be no delay in the buffer, hence the name "zero delay buffer." However, in a real application some delay is introduced by non-idealities in the PLL. For example, "static phase offset" is a specification that quantifies the phase difference between the input signal and the output signal. Static phase offset is the average phase offset between the input reference signal received by the PLL and the output of the VCO. In other words, static phase offset is the difference in time between the input and the output signals. Ideally, the static phase offset should be zero seconds for a ZDB. However, in real world applications there is always some phase error between the input and output.

FIG. 1C illustrates another timing loop. Timing loop 100B is a delay locked loop ("DLL") architecture, which is another type of timing loop. An example delay locked loop includes a phase detector 110, filter 120, and voltage controlled delay 150. An input signal to be delayed is coupled to one input of the voltage controlled delay 150, and a second input of the voltage controlled delay is coupled to the output of phase detector 110. The input signal will be delayed by an amount of time set by a voltage at the output of phase detector 110. The input signal to be delayed is also coupled to one input of phase detector 110, and the output of the voltage controlled delay 150 is coupled to the other input of the phase detector 110. In some applications feedback (such as a divider) may be included between the output of the voltage controlled delay and the input of phase detector 110. Thus, in the absences of static phase offset error, the output of the controlled delay 150 will be precisely in phase with the input signal when the loop is closed.

Typically, the majority of static phase offset error is generated in the phase detector. For example, referring to FIG. 1A, if the delay between REF input of phase detector 110 to the output of the phase detector is the same as the delay from FB input of phase detector 110 to the output then there should be no static phase offset. Similarly, if the circuitry in the phase detector is matched, then there should be no static phase offset. For example, if the phase detector includes a phase frequency detector and charge pump, then if the pull up and pull down currents in the charge pump are matched, then there should be no static phase offset. However, typically the delays are different and the circuitry is mismatched due to manufacturing variations and imperfections.

Static phase offset is problematic in timing loop designs. In particular, static phase offset in timing applications can severely impact the timing margins, such as computer system clock margins described above. Thus, it would be desirable to reduce static phase offset so that the timing margin in computer system clocks can be improved. Such improved timing margins would allow for greater and more robust system performance.

Thus, there is a need for reducing static phase offset in timing loops. The present invention solves these and other problems by providing circuits and methods for reducing static phase offset in timing loops using commutating phase detectors.

SUMMARY

Embodiments of the present invention reduce static phase offset in timing loops. In one embodiment, the present invention includes a timing loop comprising first and second phase detectors, wherein during a first time period, the first phase detector is coupled in a closed timing loop and the second phase detector is decoupled from the closed timing loop and calibrated, and during a second time period, the second phase detector is coupled in a closed timing loop and the first phase detector is decoupled from the closed timing loop and calibrated.

In one embodiment, when the first or second phase detector is calibrated, first and second inputs of the phase detector being calibrated are coupled to a common input signal.

In one embodiment, when the first or second phase detector is calibrated, at least one output of the phase detector being calibrated is coupled to a mismatch detector for detecting mismatches in the phase detector.

In one embodiment, when the first or second phase detector is calibrated, at least one output of the phase detector being calibrated is coupled to a mismatch detector for detecting a voltage drift at the output of the phase detector that is indicative of the mismatches in the phase detector.

In one embodiment, the first phase detector includes a first input, a second input, an adjust input, and an output, the second phase detector includes a first input, a second input, an adjust input, and an output, a voltage controlled oscillator having an input coupled to the output of the first phase detector and the output of the second phase detector, and an output coupled to the second input of the first phase detector and the second input of the second phase detector, and a mismatch detector having one or more inputs coupled to the output of the first phase detector and the output of the second phase detector, and one or more outputs coupled to the adjust input of the first phase detector and the adjust input of the second phase detector, wherein during the first time period, the output of the first phase detector is coupled to the voltage controlled oscillator, the first and second inputs of the second phase detector are coupled to a common input signal, and the output of the second phase detector is coupled to the mismatch detector, and in accordance therewith, the mismatch detector generates a correction signal for adjusting the second phase detector, and during a second time period, the output of the second phase detector is coupled to the voltage controlled oscillator, the first and second inputs of the first phase detector are coupled to a common input signal, and the output of the first phase detector is coupled to the mismatch detector, and in accordance therewith, the mismatch detector generates a correction signal for adjusting the first phase detector.

In one embodiment the first phase detector includes a first input, a second input, an adjust input, and an output, the second phase detector includes a first input, a second input, an adjust input, and an output, a voltage controlled delay having a first input coupled to the output of the first phase detector and the output of the second phase detector, a second input coupled to an input signal to be delayed, and an output coupled to the second input of the first phase detector and the second input of the second phase detector, and a mismatch detector having one or more inputs coupled to the output of the first phase detector and the output of the second phase detector, and one or more outputs coupled to the adjust input of the first phase detector and the adjust input of the second phase detector, wherein during the first time period, the output of the first phase detector is coupled to the voltage controlled delay, the first and second inputs of the second phase detector are coupled to a common input signal, and the output of the second phase detector is coupled to the mismatch detector, and in accordance therewith, the mismatch detector generates a correction signal for adjusting the second phase detector, and during a second time period, the output of the second phase detector is coupled to the voltage controlled delay, the first and second inputs of the first phase detector are coupled to a common input signal, and the output of the first phase detector is coupled to the mismatch detector, and in accordance therewith, the mismatch detector generates a correction signal for adjusting the first phase detector.

In one embodiment, the first and second phase detectors each comprise a phase frequency detector and a charge pump.

In one embodiment, the first and second phase detectors each further include an adjust input, wherein the adjust input of the first phase detector adjusts at least a first current in a first charge pump, and the adjust input of the second phase detector adjusts at least a second current in the second charge pump.

In one embodiment, the timing loop further comprises a first calibration capacitor coupled to the first phase detector during the second time period, and a second calibration capacitor coupled to the second phase detector during the first time period.

In one embodiment, the timing loop further comprises a window comparator coupled to an output of the second phase detector during the first time period and coupled to an output of the first phase detector during the second time period.

In one embodiment, the timing loop further comprises a current pulse generator coupled to an output of the window comparator.

In one embodiment, the timing loop further comprises a phase detector configuration controller.

In one embodiment, the phase detector configuration controller comprises a counter.

In one embodiment, the phase detector configuration controller further comprises a phase frequency detector.

In one embodiment, the timing loop is a phase locked loop or a delay locked loop.

In one embodiment, the timing loop is configured as a zero delay buffer.

In another embodiment, the present invention includes a timing loop comprising first and second phase detectors alternately configured in a correction loop and a closed timing loop, wherein during a first time period, the first phase detector is configured in the closed timing loop and the second phase detector is configured in the correction loop, and during a second time period, the second phase detector is configured in the closed timing loop and the first phase detector is configured in the correction loop.

In one embodiment, first and second inputs of the second phase detector are coupled to a common input signal during the first time period, and first and second inputs of the first phase detector are coupled to a common input signal during the second time period.

In one embodiment, the first and second phase detectors each comprise a phase frequency detector and a charge pump.

In one embodiment, the correction loop detects mismatch in the first and second phase detectors and generates a correction signal, wherein the correction signal is coupled to an adjust input of the first phase detector to adjust a first current in a first charge pump during the second time period, and the correction signal is coupled to an adjust input of the second phase detector to adjust a second current in a second charge pump during the first time period.

In one embodiment, the correction loop comprises a first calibration capacitor coupled to the first phase detector during the second time period and a second calibration capacitor coupled to the second phase detector during the first time period.

In one embodiment, the correction loop comprises a window comparator.

In one embodiment, the correction loop further comprises a current pulse generator.

In one embodiment, the timing loop further comprises a counter for controlling the duration of the first and second time periods.

In one embodiment, the timing loop further comprises a phase frequency detector coupled to an input of the counter.

In one embodiment, the timing loop is a phase locked loop or a delay locked loop.

In one embodiment, the timing loop is configured as a zero delay buffer.

In another embodiment, the present invention includes a method comprising, during a first time period, configuring a first phase detector to control a timing loop, calibrating a second phase detector, and during a second time period, configuring the second phase detector to control the timing loop, and calibrating the first phase detector.

In one embodiment, first and second inputs of the second phase detector are coupled to a common input signal during the first time period, and first and second inputs of the first phase detector are coupled to a common input signal during the second time period.

In one embodiment, the timing loop is a phase locked loop or a delay locked loop.

In one embodiment, the timing loop is configured as a zero delay buffer.

In one embodiment, during the first time period calibrating comprises detecting mismatches in the second phase detector, and during the second time period calibrating comprises detecting mismatches in the first phase detector.

In one embodiment, during the first time period calibrating comprises detecting a voltage drift at the output of the second phase detector, and during the second time period calibrating comprises detecting a voltage drift at the output of the first phase detector.

In one embodiment, during the first time period calibrating further comprises comparing the voltage drift at the output of the second phase detector to at least one reference voltage, and during the second time period calibrating further comprises comparing the voltage drift at the output of the first phase detector to at least one reference voltage.

In one embodiment, the first phase detector comprises a first phase frequency detector and a first charge pump, and the second phase detector comprises a second phase frequency detector and a second charge pump.

In one embodiment, during the first time period calibrating further comprises adjusting a voltage on a gate of a first transistor coupled to one or both of a current source or current sink in the second charge pump, and during the second time period calibrating further comprises adjusting a voltage on a gate of a second transistor coupled to one or both of a current source or current sink in the first charge pump.

In yet another embodiment, the present invention includes a method comprising, during a first time period, configuring a first phase detector to control a timing loop, detecting a first mismatch in the second phase detector, and reducing the first mismatch generated by the second phase detector, during a second time period, configuring the second phase detector in a timing loop, detecting a second mismatch in the first phase detector, and reducing the second mismatch generated by the first phase detector.

In one embodiment, first and second inputs of the second phase detector are coupled to a common input signal during the first time period, and first and second inputs of the first phase detector are coupled to a common input signal during the second time period.

In one embodiment, reducing includes adjusting the amount of current generated at an output of the first or second phase detectors to reduce the first or second mismatch.

In one embodiment, the first phase detector comprises a first phase frequency detector and a first charge pump, and the second phase detector comprises a second phase frequency detector and a second charge pump.

In one embodiment, during the first time period, reducing comprises adjusting a voltage on a gate of a first transistor coupled to one or both of a current source or current sink in the second charge pump, and during the second time period reducing comprises adjusting a voltage on a gate of a second transistor coupled to one or both of a current source or current sink in the first charge pump.

In one embodiment, during the first time period, detecting comprises comparing a voltage drift at an output of the second phase detector to at least one reference voltage, and during the second time period detecting comprises comparing a voltage drift at an output of the first phase detector to at least one reference voltage.

The following detailed description and accompanying drawings provide a better understanding of the nature and advantages of the present invention.

DETAILED DESCRIPTION

Figure 1A:
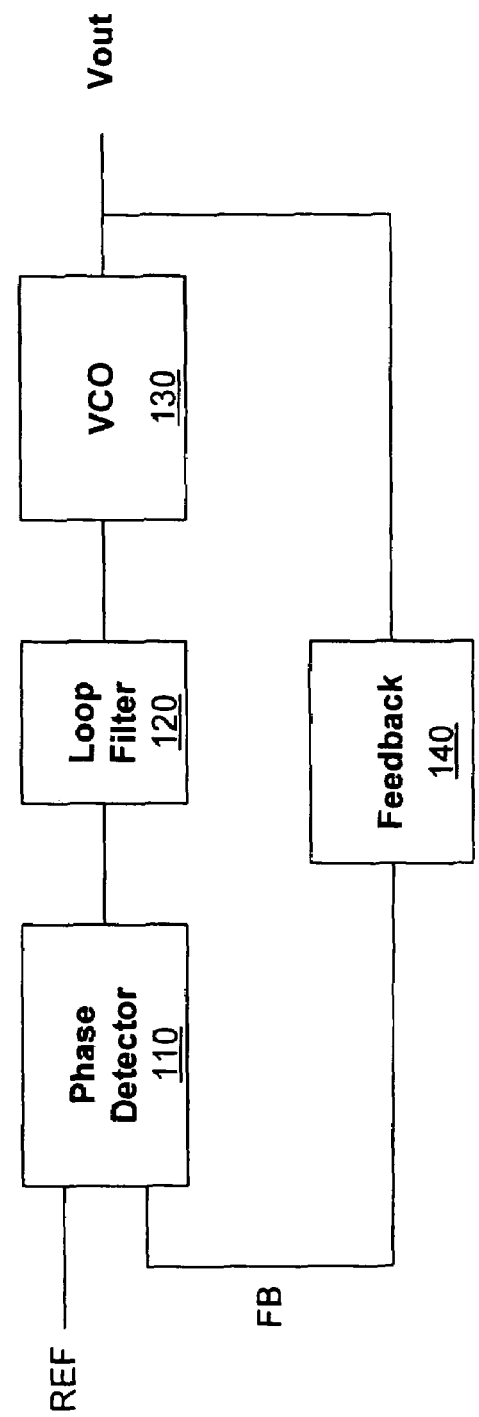
FIG. 1A illustrates a phase locked loop architecture.

Described herein are techniques for reducing static phase offset in timing loops. In the following description, for purposes of explanation, numerous examples and specific details are set forth in order to provide a thorough understanding of embodiments of the present invention. It will be evident, however, to one skilled in the art that the embodiments of the invention as defined by the claims may include some or all of the features in these examples alone or in combination with other features described below, and may further include obvious modifications and equivalents of the features and concepts described herein.

Embodiments of the present invention reduce static phase offset by detecting mismatches in the phase detector, such as mismatched delays or currents, that contribute to static phase offset, and calibrate out the mismatches to reduce static phase offset. In one embodiment, a timing loop includes first and second phase detectors, wherein during a first time period, the first phase detector is coupled in a closed timing loop and the second phase detector is decoupled from the closed timing loop and calibrated. During a second time period, the second phase detector is coupled in a closed timing loop and the first phase detector is decoupled from the closed timing loop and calibrated. By commutating between phase detectors, one phase detector may be used to control the timing loop while the other phase detector is calibrated. After one phase detector is calibrated, it may be used to control the loop while the other phase detector is calibrated. Calibration may be used to eliminate or reduce mismatches in each phase detector that contribute to static phase offset error. In one embodiment, the phase detectors are alternately configured in a correction loop to perform calibration. A correction loop may detect operational parameters of the phase detector that relate to static phase error and generate a correction signal that is fed back into the phase detector being calibrated to null out (or autozero) the error. For example, a correction loop may detect mismatches, such as mismatched currents, in the phase detector. When phase detector is in a closed timing loop, these mismatches may result in a static phase offset. Thus, the correction signal may adjust the operation of the phase detector to reduce the mismatch, and thereby reduce the static phase offset. In one embodiment, mismatch may result in a voltage drift that is indicative of one or more mismatches in the phase detector. For example, the voltage drift may be at the output of the phase detector. Ideally, if both inputs of the phase detector receive the same input, then there should be no voltage drift at the output. Therefore, in one embodiment, a common input signal may be applied to both inputs of the phase detector being calibrated. The correction loop may detect any voltage drifts that may arise while the phase detector is receiving a common input, and generate a correction signal to reduce the mismatch causing the drift.

Figure 2A:
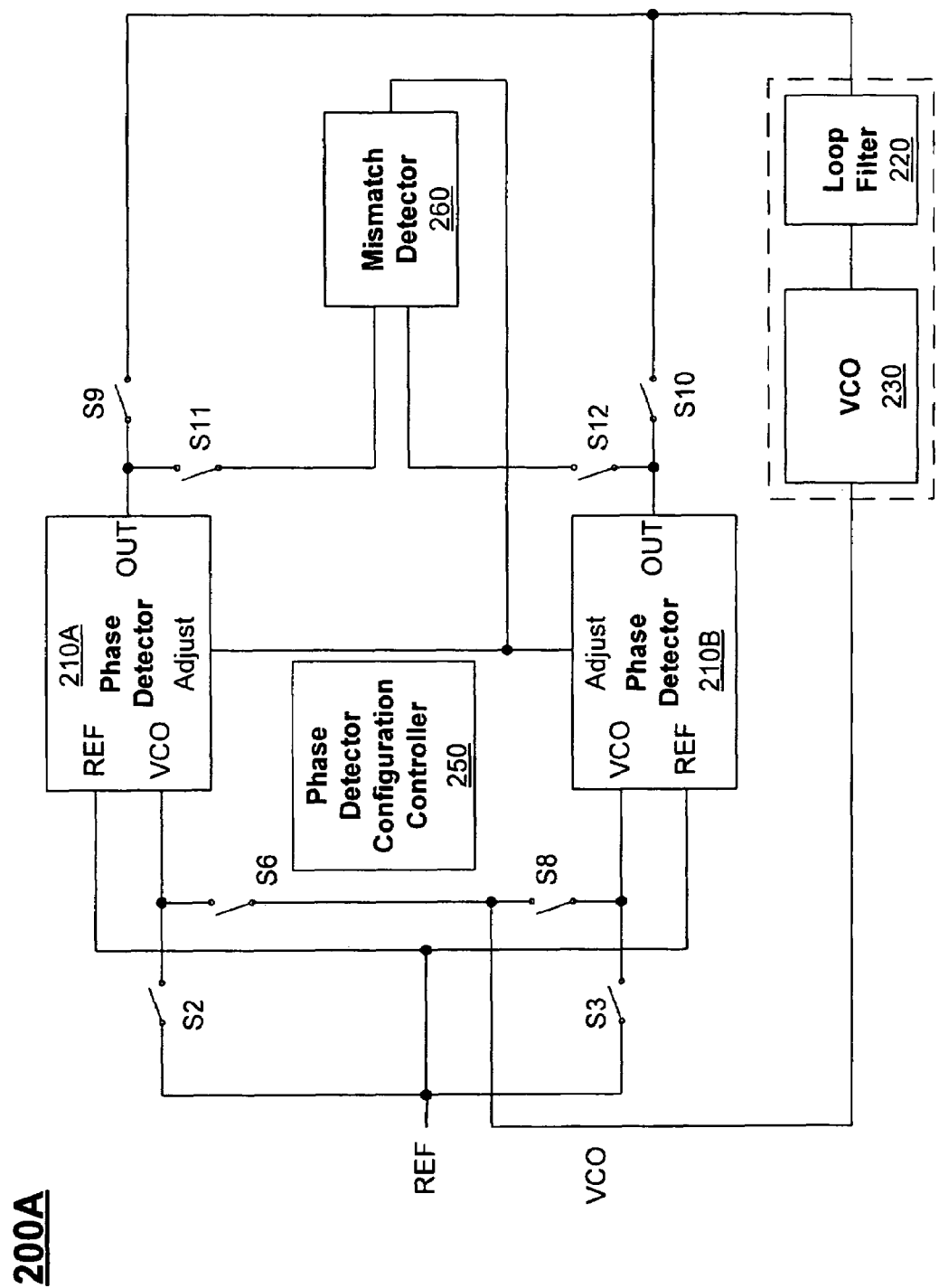
FIG. 2A illustrates a timing loop according to one embodiment of the present invention.

FIG. 2A illustrates a phase locked loop according to one embodiment of the present invention. In one embodiment, phase locked loop 200A includes first and second phase detectors 210A and 210B that are alternately coupled to an mismatch detector 260 and a voltage controlled oscillator 230 during different time periods. For example, in order to reduce static phase offset in the system, one phase detector may be used to control the timing loop while the other phase detector goes through a calibration cycle (i.e. a correction cycle). In this example, a reference signal ("REF") is received in both phase detectors, and the phase detector outputs are alternately coupled through a loop filter 220 and VCO 230 to feedback inputs of each phase detector (here labeled "VCO"). When a correction cycle is completed, the phase detectors alternate (i.e., exchange roles), and the corrected phase detector is used to control the timing loop while the other phase detector goes through a correction cycle. In other words, embodiments of the present invention periodically disconnect one phase detector from the timing loop to correct the static phase offset. However, loop control must be maintained. Thus, two phase detectors are included so that when one phase detector is disconnected from the loop to be corrected, the other phase detector is configured into the loop and used to maintain control of the loop. Once one phase detector has been corrected, the system is reconfigured to switch the corrected phase detector into the loop and the other phase detector out of the loop for static phase offset correction. Thus, the system alternates (commutates) between two phase detectors to reduce static phase offset while maintaining control of the loop.

During static phase offset correction, the feedback input (here, VCO) of one of the phase detectors (e.g., PD 210A) is decoupled from the timing loop (e.g., switch S6 is opened) and coupled to a common input signal (e.g., switch S2 is closed). In this example, the common input signal is the REF input. However, other signals could be used. The output of the phase detector to be calibrated is decoupled from the timing loop (e.g., switch S9 is opened) and into a correction loop. For example, the output of the phase detector may be coupled to mismatch detector 260 (e.g., switch S11 is closed). Ideally, when the loop is open and the same signal is applied to both inputs of the phase detector, there should be no net change in the output of the phase detector if the delays and circuits are perfectly matched. For example, if the delay between REF and the output is the same as the delay between VCO and the output, or if the circuitry is matched, then there should be no static phase offset. However, typically the delays are different and the circuits are mismatched due to manufacturing variations and imperfections. Thus, if the same signal is applied to both inputs, there will be a net change at the output. The net change will translate into a static phase offset between the REF and VCO signals when the timing loop is closed. Accordingly, embodiments of the present invention detect the change at the output of the phase detector when a common signal is applied to the inputs and adjust the circuitry in the phase detector to reduce the detected change.

During calibration, mismatch detector 260 is coupled to the output of the phase detector to detect changes in the phase detector output. Thus, mismatch detector 260 may include inputs coupled through switches S11 and S12 to alternately detect changes in both phase detectors. The output of mismatch detector 260 includes a correction signal that is coupled to an adjust input of phase detector 210A and an adjust input of phase detector 210B. A variety of circuit techniques may be used to detect mismatch in phase detectors, and a variety of correction signals and adjustment techniques may be used to calibrate the phase detector. In particular, if the change in the output of the phase detector is positive, then the adjustments (e.g., to delays, currents, or voltages) should cause the output to change in the negative direction. Similarly, if the change in the output of the phase detector is negative, then the adjustments should cause the output to change in the positive direction.

In accordance with this embodiment, during a first time period, phase detector 210A is configured in a closed loop with voltage controlled oscillator 230, and phase detector 210B is in a correction loop with mismatch detector 260, and in accordance therewith, mismatch detector 260 reduces the static phase offset generated by phase detector 210B. Similarly, during a second time period, phase detector 210B is configured in a closed loop with voltage controlled oscillator 230, and phase detector 210A is in a correction loop with mismatch detector 260, and in accordance therewith, mismatch detector 260 reduces the static phase offset generated by phase detector 210A. In one embodiment, phase locked loop 200A further comprises a phase detector configuration controller 250. Configuration controller 250 may be used to reconfigure the phase detectors between closed loop configuration and calibration. As illustrated below, an example configuration controller may include a counter to periodically reconfigure the phase detectors.

Figure 2B:
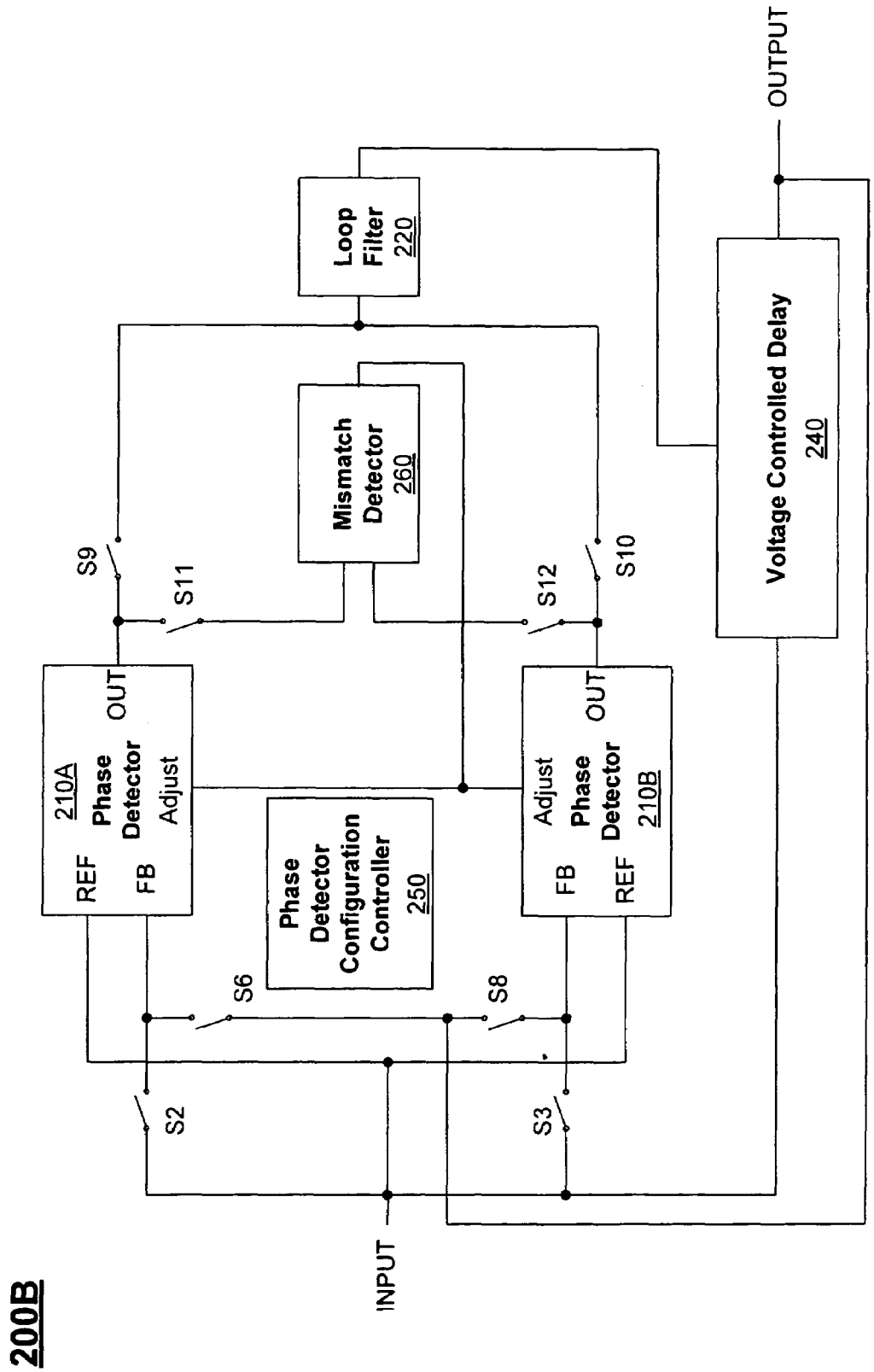
FIG. 2B illustrates a timing loop according to another embodiment of the present invention.

FIG. 2B illustrates a delay locked loop ("DLL") including commutating first and second phase detectors 210A and 210B that are alternately configured in a closed timing loop while the other is calibrated. The DLL 200B further includes a loop filter 220, voltage controlled delay 240, mismatch detector 260, and phase detector configuration controller 250. Loop filter 220 is coupled through switches S9 and S10 to the outputs of phase detectors 210A and 210B. The output of loop filter 220 is coupled to one input of voltage controlled delay 240, and a second input of voltage controlled delay 240 is coupled to an input signal ("INPUT"). The output of voltage controlled delay 240 is coupled through switches S6 and S8 to the feedback inputs ("FB") of phase detectors 210A and 210B. The input signal is coupled to the reference inputs ("REF") of phase detectors 210A and 210B. The input is also coupled through switches S2 and S3 to the FB input of phase detectors 210A and 210B. In this example, when phase detector 210A is being calibrated, switches S2 and S11 are closed, and switches S6 and S9 are open. Thus, both the REF and FB inputs of phase detector 210A receive the same signal (e.g., here, the input signal) for calibration. During the time that phase detector 210A is being calibrated, switches S8 and S10 are closed, and switches S3 and S12 are open. Thus, phase detector 210B is configured to control the timing loop. When the phase detectors commutate (i.e., exchange roles), switches S2 and S11 are opened, and switches S6 and S9 are closed. Thus, phase detector 210A is configured to control the timing loop. During this time period, switches S8 and S10 are opened, and switches S3 and S12 are closed. Accordingly, phase detector 210B may be calibrated while phase detector 210A controls the timing loop.

EXAMPLE IMPLEMENTATION

Figure 3:
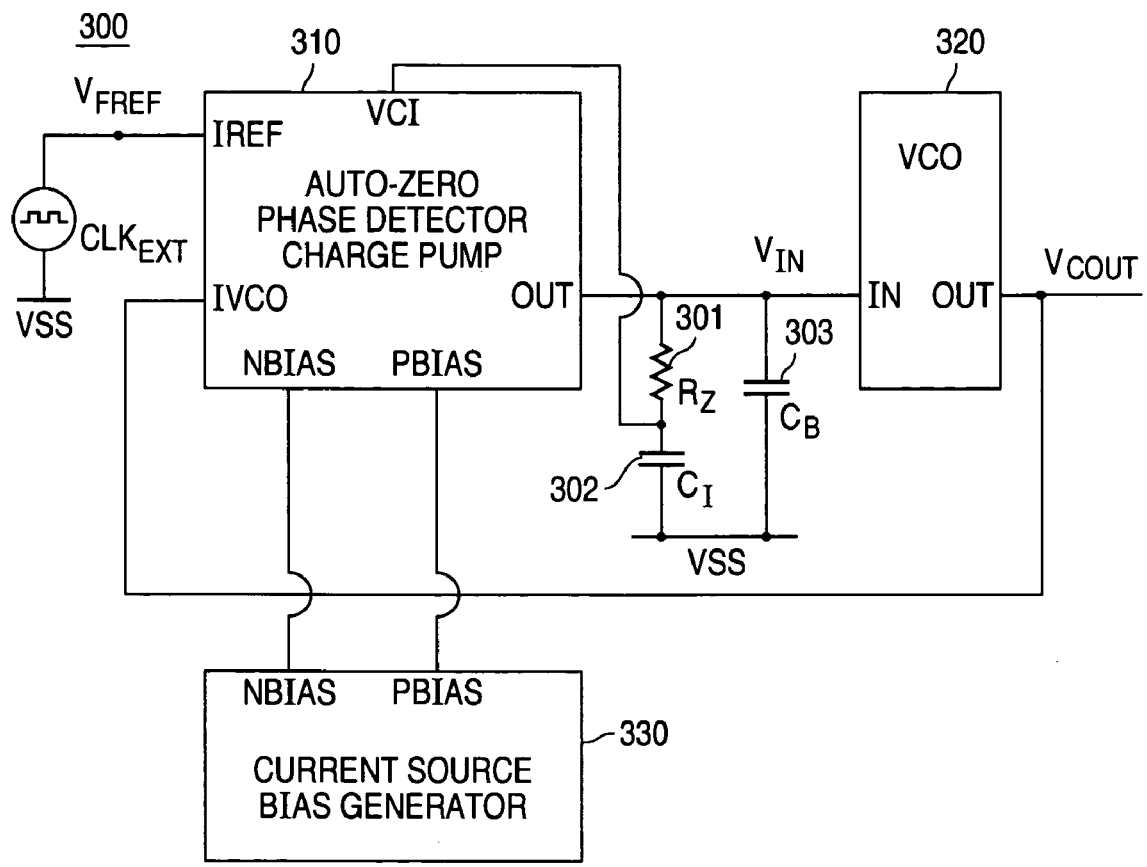
FIG. 3 is an example application of a phase locked loop with reduced static phase offset according to one embodiment of the present invention.

FIG. 3 is an example application of a timing loop 300 with reduced static phase offset according to one embodiment of the present invention. FIG. 3 shows a typical implementation of a zero delay buffer ("ZDB") using a phase locked loop ("PLL"). PLL 300 includes an auto-zero phase-frequency detector/charge pump 310 ("PFD-CP"), which is a specific implementation of the commutating phase detector approach described above. PLL 300 further includes a VCO 320, current source bias generator 330, and loop filter including resistor 301 ("$R_Z$"), integration capacitor 302 ("$C_I$"), and capacitor 303 ("$C_B$"). A first input to the PFD-CP 310 labeled IREF is coupled to a clock signal ("$CLK_{EXT}$"), which may be an external clock, for receiving a signal $V_{FREF}$. The second input of the PFD-CP 310 labeled IVCO is coupled to the output of VCO 320 labeled OUT to receive output signal $V_{COUT}$, which may also be the system output. Bias generator 330 generates the necessary voltages and currents for biasing circuits in PFD-CP 310 and possibly other circuits.

Figure 1B:
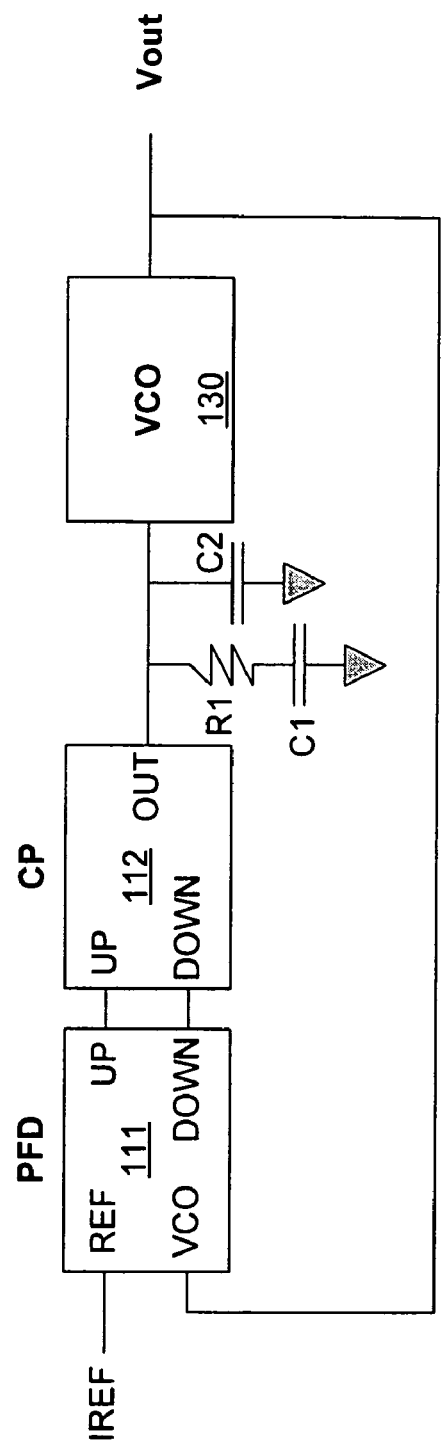
FIG. 1B illustrates a zero delay buffer.
Figure 1C:
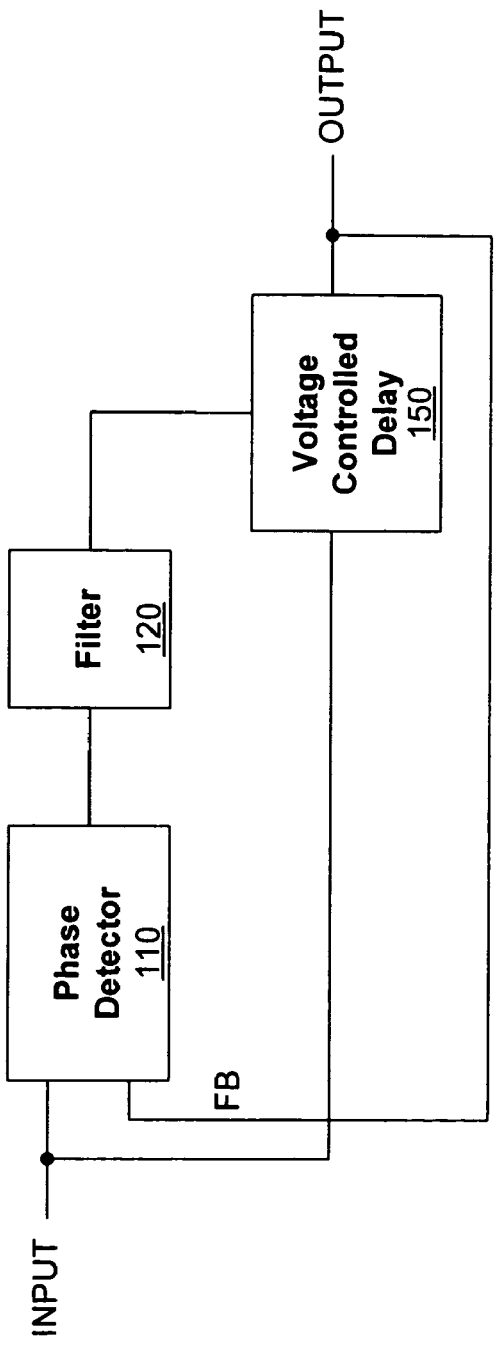
FIG. 1C illustrates a delay locked loop.

Referring again to FIG. 1B, for an ideal ZDB, the input signal, IREF, would be exactly in phase with the output signal $V_{OUT}$. This ideal ZDB, therefore, would have a static phase offset of zero seconds. Embodiments of the present invention may be used to substantially reduce the amount of static phase offset in a ZDB, for example, caused by various imperfections in the semiconductor process. In particular, non-zero static phase offset typically is caused by manufacturing variations and imperfections in the phase-frequency detector ("PFD") and charge pump ("CP"). If the PFD operated ideally, the propagation delay from the VCO feedback input of the PFD to the output DOWN (e.g., see FIG. 1B) would be exactly equal to the propagation delay from the REF input to the output UP. If the CP operated ideally, there would be no net charge produced at the output when the inputs, UP and DOWN, receive signals that have exactly the same pulse width. If the PFD and CP together operated ideally, there would be no net charge delivered from the CP output, OUT, when the PFD input signals, IREF and $V_{OUT}$, have exactly the same phase. However, since the actual PFD and CP are non-ideal, if IREF and $V_{OUT}$ are exactly in phase, then the CP will produce some non-zero amount of charge at the output and into the PLL's loop filter. In a closed loop, the PLL will translate the non-zero charge into a static phase offset between IREF and $V_{OUT}$.

In the example shown in FIG. 3, an auto-zeroing phase detector technique is used to reduce static phase offset. In this example, the voltage on the integration capacitor 302 is provided at a VCI input of the improved auto-zero PFD-CP 310. As illustrated by the example in FIG. 4, this voltage may be used, together with the architecture described above, to reduce static phase offset.

Figure 6:
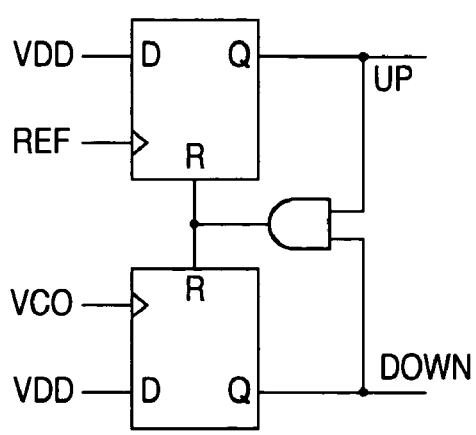
FIG. 6 is an example of a phase-frequency detector according to one embodiment of the present invention.
Figure 4A:
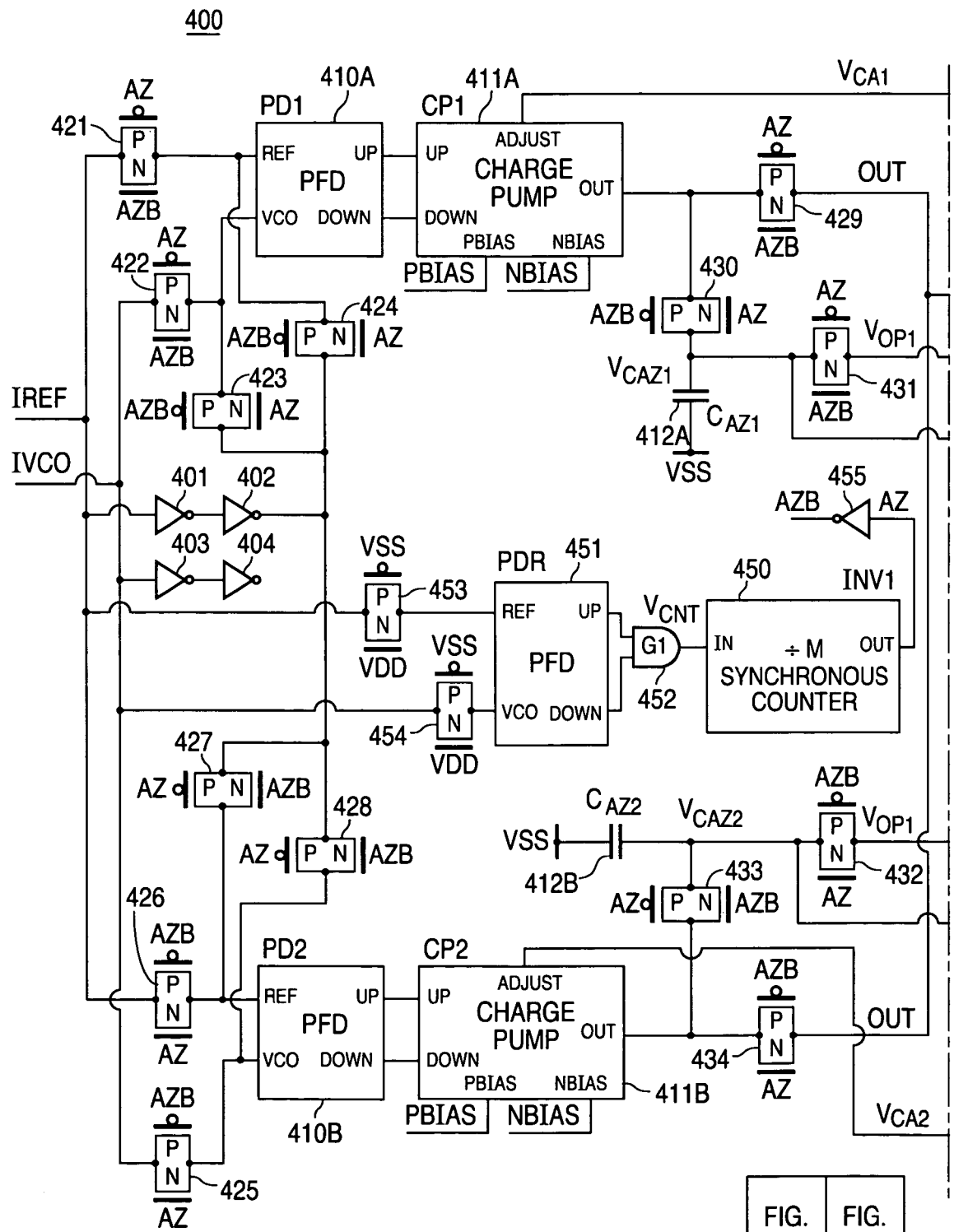
FIG. 4 is an example of an auto-zero phase detector according to one embodiment of the present invention.
Figure 4B:
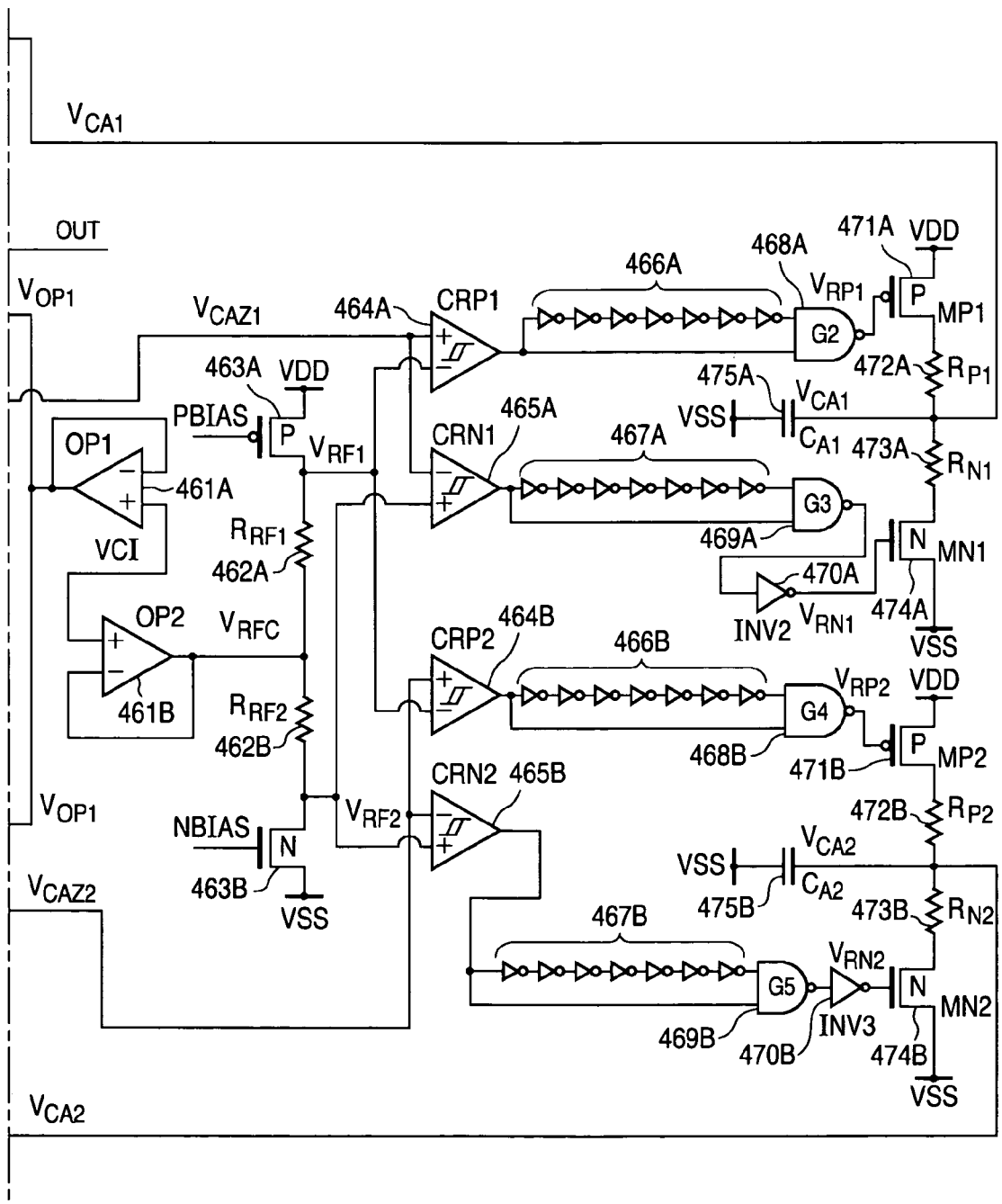

FIG. 4 is an example of an auto-zero phase detector 400 ("AZPD") according to one embodiment of the present invention. AZPD 400 includes two phase-frequency detector and charge pump combinations ("PFD-CP"). The first PFD-CP includes PFD 410A ("PD1") and CP 411A ("CP1"). The second PFD-CP includes PFD 410B ("PD2") and CP 41B ("CP2"). An example phase-frequency detector that may be used is shown in FIG. 6. When one of the PFD-CPs is disconnected from the timing loop for mismatch correction, the other PFD-CP is configured into the timing loop to maintain loop control. After one PFD-CP has been through a correction cycle, the other PFD-CP is disconnected from the loop for correction, and the previously corrected PFD-CP is configured into the loop to maintain loop control. Thus, the two PFD-CP combinations commutate (i.e., exchange) operational states between a correction (or calibration) state and a feedback control state. Thus, each PFD-CP can be periodically corrected while maintaining feedback control of the timing loop.

In particular, when PFD 410B and CP 411B are configured in a feedback control state and PFD 410A and CP 411A are configured in a correction state, switches 421 and 422 are open and switches 423 and 424 are closed. The switches in this example are implemented using parallel N-channel and P-channel MOS transistors. Thus, the reference signal input IREF and feedback signal input IVCO are disconnected from the REF and VCO inputs of PD1. Rather, the IREF input is buffered by two inverters 401 and 402 and provided to both inputs of PD1 through switches 423 and 424. Thus, both the REF and VCO inputs of PD1 receive a common input signal. Furthermore, the output OUT of auto-zero phase detector 400 is decoupled from the output of CP1 by opening switch 429. Instead, the output of CP1 is coupled through switch 430 to calibration capacitor 412A ("$C_{AZ1}$").

It should be noted that prior to entering a correction cycle, switch 431 is closed and switch 430 is open. In this configuration, calibration capacitor 412A will be driven by the output of unity gain buffer 461A, which in turn receives an input from VCI—the voltage on the integration capacitor 302 in the loop filter (see FIG. 3). Thus, when the output of CP1 is disconnected from the timing loop and connected to calibration capacitor 412A, the voltage on calibration capacitor 412A is initially VCI. Additionally, when the correction cycle begins, switch 431 is opened so that the voltage on calibration capacitor 412A may be driven by the output of CP1.

As mentioned above, at the beginning of a correction cycle, the voltage on capacitor 412A is VCI. When switch 430 is closed, the output of CP1 is coupled to the calibration capacitor 412A. Calibration capacitor 412A is, in this example, coupled to a window comparator for detecting when the voltage on capacitor 412A is above or below a threshold. In this example, the threshold of the comparator is generated around VCI using unity gain buffer 461B ("OP2") and series connected resistors 462A-B and transistors 463A-B. The reason for this is that the static phase offset error in the charge pump may be a function of the voltage on $V_{IN}$ (see FIG. 3). Thus, when a correction cycle occurs it may be desirable to have the voltage on the calibration capacitor to be the same as the voltage at the output of the CP when the CP is configured in the timing loop. However, when PD1 and CP1 are in closed loop mode and the timing loop is locked, there is very little current going into $R_Z$, so the voltage on $C_I$ and $C_B$ are substantially the same. Normally, $C_I$ is larger (e.g., 10 times larger) than $C_B$. Thus, in lock VCI and $V_{IN}$ are substantially the same. However, VCI has less electrical noise. Since $V_{IN}$ and VCI are about the same, $V_{OP1}$ is generated from VCI and is used to set the initial voltage on the calibration capacitor at the beginning of each correction cycle. As mentioned above, VCI is couple through unity gain buffer 461A ("OP1") to the calibration capacitor when the PD is in the timing loop. When the PFD-CP enters a correction cycle, $V_{OP1}$ is disconnected from the calibration capacitor so that the voltage on the calibration capacitor can change. In this example, the circuit detects mismatch by determining the polarity of the voltage drift on the calibration capacitor. Thus, when the CP is disconnected from the loop, the calibration capacitor voltage is at the same voltage as the VCI, which is also the center of the comparator window.

In this example, calibration capacitor 412A is coupled to a window comparator. Here, capacitor 412A is coupled to the positive input of a first comparator 464A and the negative input of a second comparator 465A. The negative input of comparator 464A is coupled to resistor 462A ("$R_{RF1}$"), which is the high threshold voltage (i.e., upper trip point), $V_{RF1}$, of the comparator window. Thus, the voltage on calibration capacitor 412A, $V_{CAZ1}$, will initially be VCI, which is below the high threshold voltage, and the output of comparator 464A is initially low (i.e., because the negative input, $V_{RF1}$, is initially at a higher voltage than the positive input, $V_{CAZ1}$). However, if the voltage on the calibration capacitor increases above the high threshold voltage during the correction cycle (e.g., because of circuit mismatches in the PFD or CP), the output of comparator 464A will transition from low to high. A positive going voltage on the calibration capacitor may indicate that the charge pump is sourcing more current than it is sinking, for example. Thus, to correct this mismatch, when the window comparator detects a positive going voltage on the calibration capacitor, a correction signal is generated to trigger a reduction in the charge pump current source and/or increase the charge pump current sink. In this example, the correction signal is a voltage on capacitor 475A, which is coupled to the adjust input of CP 411A. The correction signal is generated by coupling the output of comparator 464A directly to one input of a NAND gate 468A and to the other input of NAND gate 468A through a delay circuit 466A comprising series connected inverters to create a pulse. The pulse turns PMOS transistor 471A on to generate a correction current through resistor 472A into capacitor 475A to change the voltage on the adjust input of CP 411A. The correction signal may be used to adjust the source current in CP 411A, for example.

Similarly, calibration capacitor 412A is coupled to the negative input of a second comparator 465A. The positive input of comparator 465A is coupled to resistor 462B ("$R_{RF2}$"), which is the low threshold voltage (i.e., lower trip point), $V_{RF2}$, of the comparator window. Thus, the voltage on calibration capacitor 412A, $V_{CAZ1}$, will initially be VCI, which is above the low threshold voltage, and the output of comparator 465A is initially low (i.e., because the negative input, $V_{CAZ1}$, is initially at a higher voltage than the positive input, $V_{RF2}$). However, if the voltage on the calibration capacitor decreases below the low threshold voltage during the correction cycle (e.g., because of mismatched circuits in the PFD or CP), the output of comparator 465A will transition from low to high. A negative going voltage on the calibration capacitor may indicate that the charge pump is sinking more current than it is sourcing, for example. Thus, to correct this mismatch, when the window comparator detects a negative going voltage on the calibration capacitor, a correction signal is generated to trigger a reduction in the charge pump current sink and/or increase the charge pump current source. The correction signal is generated by coupling the output of comparator 465A directly to one input of a NAND gate 469A and to the other input of NAND gate 469A through a delay circuit 467A comprising series connected inverters to create a pulse. The pulse turns NMOS transistor 474A on to generate a correction current through resistor 473A into capacitor 475A to change the voltage on the adjust input of CP 411A.

As illustrated by the above example, comparators may be used to determine the polarity of the error so that correction may be made in the opposite direction. For noise considerations, a window may be used so that a minimum change in voltage on the calibration capacitor is required before any correction is made. Thus, if a designer opts to use a window comparator implementation to detect mismatch at the output of the phase detector, the voltage range of the comparator window may be set according to the noise tolerance of the system. The amount that the voltage on the calibration capacitor may increase or decrease before triggering a correction signal may be set to achieve target static phase offset tolerance. It is to be understood that other techniques may be used to detect changes at the output of the phase detector, such as by averaging out the noise, for example.

Figure 5:
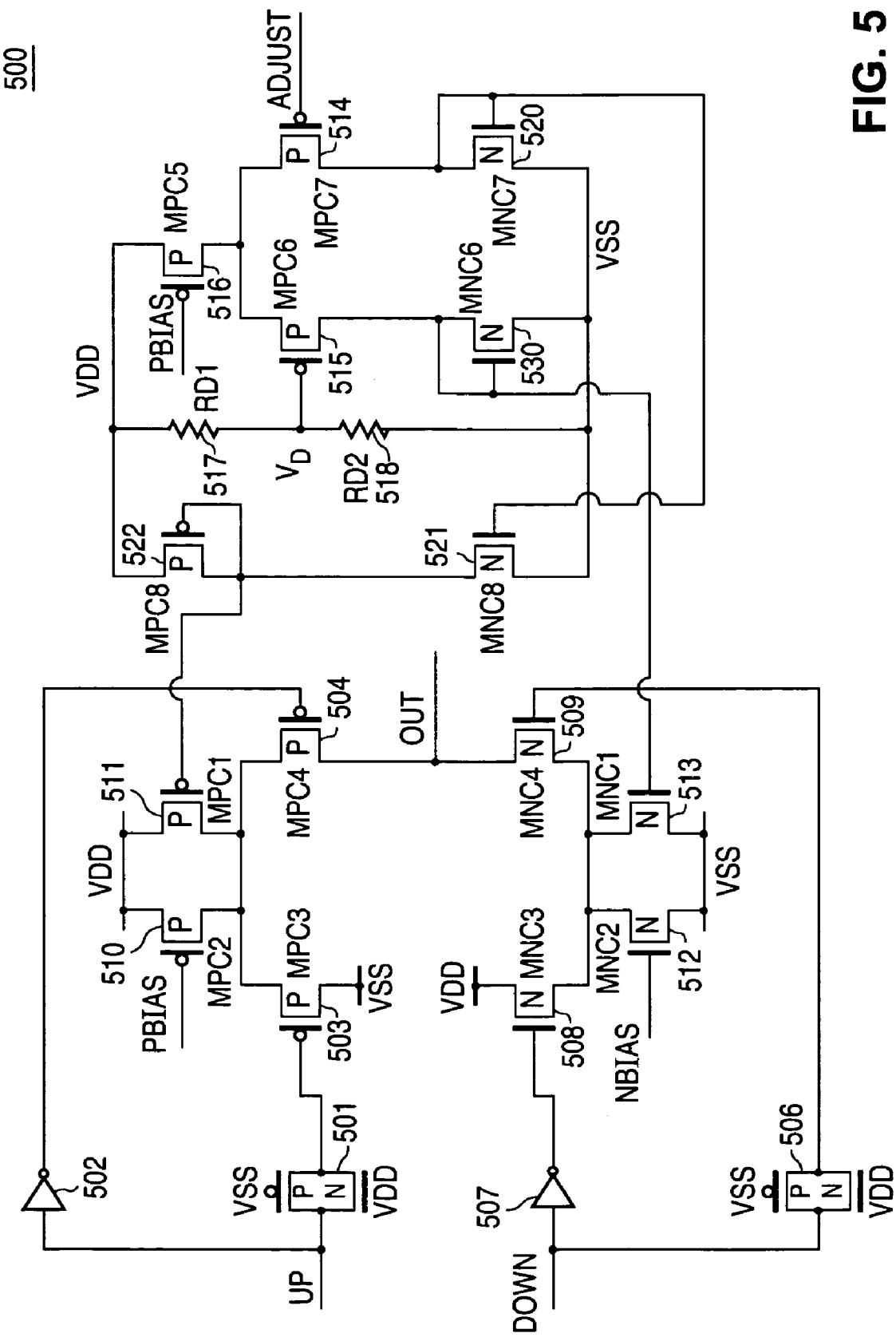
FIG. 5 is an example of an adjustable charge pump according to one embodiment of the present invention.

FIG. 5 is an example of an adjustable charge pump 500 according to one embodiment of the present invention. Charge pump 500 ("CP") includes a first input "UP" coupled through switch 501 and inverter 502 to a differential current steering network including PMOS transistors 503 ("MPC3"), 504 ("MPC4"), 510 ("MPC2"), and 511 ("MPC1"). The gate of transistor 504 is coupled though inverter 502 to the "UP" input terminal. When a positive going signal is received on the "UP" terminal, inverter 502 changes the polarity so that transistor 504 is activated when an UP signal is received. The UP signal is also coupled through switch 501 (here, a transmission gate including parallel PMOS and NMOS devices) to the gate of PMOS transistor 503. Switch 501 is used to delay the signal by a time period approximately equal to the delay of inverter 502. When a positive going signal is received at the UP terminal, transistor 503 will turn off. Since transistors 503 and 504 are biased by common devices 510 and 511, a signal received at the UP input terminal will steer current between devices 503 and 504. The current through transistor 504 is used to drive the output of CP 500. This current is referred to as the charge pump source current.

Similarly, charge pump 500 ("CP") includes a second input "DOWN" coupled through switch 506 and inverter 507 to a differential current steering network including NMOS transistors 508 ("MNC3"), 509 ("MNC4"), 512 ("MNC2"), and 513 ("MNC1"). The gate of transistor 508 is coupled though inverter 507 to the "DOWN" input terminal. When a positive going signal is received on the "DOWN" terminal, inverter 507 changes the polarity so that transistor 508 is inactivated when a "DOWN" signal is received. The "DOWN" signal is also coupled through switch 506 to the gate of NMOS transistor 509. Switch 506 is used to delay the signal by a time period approximately equal to the delay of inverter 507. When a positive going signal is received at the "DOWN" terminal, transistor 509 will turn on. Since transistors 508 and 509 are biased by common devices 512 and 513, a signal received at the "DOWN" input terminal will steer current between the devices 508 and 509. The current through transistor 509 is also used to drive the output of CP 500. This current is referred to as the charge pump sink current.

Figure 7:
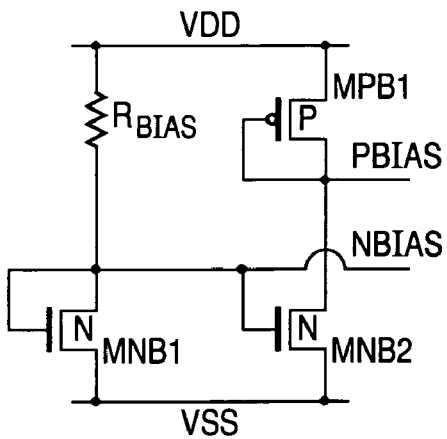
FIG. 7 is an example of a bias generator according to one embodiment of the present invention.

Ideally, transistors 503, 504, 510, 508, 509, and 512 should be designed so that the source and sink currents are exactly matched. Thus, if the "UP" and "DOWN" pulses are exactly the same, an equal amount of current will be sourced to and sunk from the output. This ideal case would produce zero static phase offset. However, typically there will always be some device mismatch. Moreover, the bias circuits used to generate PBIAS for transistor 510 and NBIAS for transistor 512 may also include some error. An example bias circuit for producing PBIAS and NBIAS is shown in FIG. 7. In this example, the source and sink currents may be adjusted by including transistor 511 in parallel with transistor 510, and including transistor 513 in parallel with transistor 512. These devices may be used to modify the source and sink currents in transistors 504 and 509 to reduce mismatch and the corresponding static phase offset. In this example, an adjust input terminal of CP 500 is coupled to the gate of PMOS transistor 514. Transistor 514 is one-half of a differential pair. The other differential transistor is PMOS device 515. Transistors 514 and 515 are biased by PMOS transistor 516, which has a gate coupled to a bias voltage, PBIAS, and a drain coupled to the common sources of transistors 514 and 515. The gate of transistor 515 is coupled to a resistor divider including resistors 517 and 518. These resistors set the voltage $V_D$ at the gate of device 515. Current in the drain of transistor 514 is coupled through current mirrors comprising transistors 520, 521, 522, and 511 to source coupled transistors 503 and 504. Similarly, current in the drain of transistor 515 is coupled through current mirrors comprising transistors 530 and 513 to source coupled transistors 508 and 509. Thus, when the adjust input increases above $V_D$, the current in transistor 513 increases and the current in transistor 511 decreases, thereby increasing the sink current in transistor 509 and decreasing the source current in transistor 504. Similarly, when the adjust input decreases below $V_D$, the current in transistor 511 increases and the current in transistor 513 decreases, thereby increasing the source current in transistor 504 and decreasing the sink current in transistor 509.

Consequently, referring to FIG. 4, it can be seen that when a mismatch results in the source current being greater than the sink current, the voltage on the calibration capacitor will increase and cause comparator 464A to change states. This will result in a current pulse into capacitor 475A, which will increase the voltage on the adjust terminal. Increasing the voltage on the adjust terminal will, in turn, decrease the source current and increase the sink current. Accordingly, the mismatch may be reduced. Likewise, it can be seen that when a mismatch results in the sink current being greater than the source current, the voltage on the calibration capacitor will decrease and cause comparator 465A to change states. This will result in a current pulse out of capacitor 475A through transistor 474A (i.e., a discharge current pulse), which will decrease the voltage on the adjust terminal. Decreasing the voltage on the adjust terminal will, in turn, increase the source current and decrease the sink current. Accordingly, the mismatch error may again be reduced.

As mentioned above, when phase-frequency detector 410A and charge pump 411A in FIG. 4 are being calibrated, phase-frequency detector 410B and charge pump 411B are configured to control the timing loop. Additionally, during this time period a second calibration capacitor 412B is coupled to the output of opamp 461A and set to a voltage of VCI (the voltage on the loop integration capacitor). Thus, during a second time period phase-frequency detector 410A and charge pump 411A are reconfigured to control the timing loop and phase-frequency detector 410B and charge pump 411B may be calibrated (i.e., switches 423, 424, 430, 425, 426, 432, 434 are opened and switches 421, 422, 429, 431, 427, 428, 433 are closed). In this example, the circuitry for detecting the mismatch in phase-frequency detector 410B and charge pump 411B operates in the same way as the circuitry for detecting the offset in phase-frequency detector 410A and charge pump 411A, wherein the high and low threshold voltages around VCI are again set by the voltages across resistors 462A-B, and devices 464-475A have corresponding counterparts for 464-475B for correcting PFD 410B and CP 411B. Counter 450 may be used to generate autozero signals, AZ and AZB, to control the switches to alternate between phase detectors. In one embodiment, the modulus for the counter is eight (M=8), so every four cycles the system switches between PFD-CPs. It may be desirable in some implementations to alternate between PFD-CPs after all phase information has been received (e.g., after the phase information from both IREF and IVCO have been received). After both edges have been received, no more timing information is received until the next cycle. Thus, in this example, the counter is driven by both the reference signal IREF and feedback signal IVCO through transmission gates 453 and 454, phase-frequency detector 451, and AND gate 452. PFD 451 may be used to ensure that the counter only switches the system after both REF and VCO edges have been received. Devices 453 and 454 may be used to approximately match the delays of switches 421, 422, 425, and 426.

Figure 8:
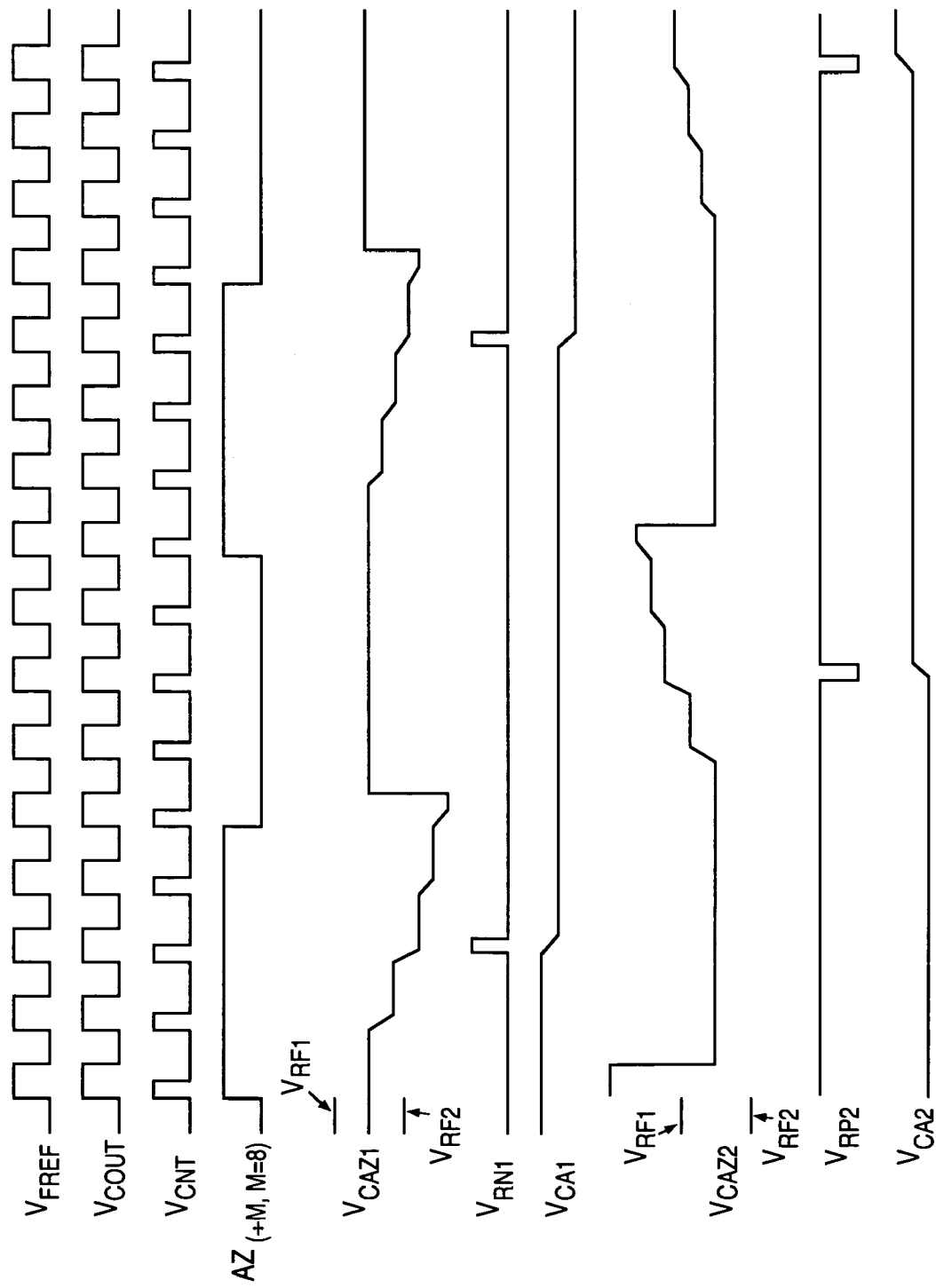
FIG. 8 shows example waveforms for a circuit according to one embodiment of the present invention.

FIG. 8 shows example waveforms for a circuit according to one embodiment of the present invention. Operation of the examples shown in FIGS. 3-7 may be understood by referring to the timing diagram shown in FIG. 8. In the timing diagram, the phase-frequency detector and charge pump is assumed to be used in a zero delay buffer application. In the timing diagram of FIG. 8, the PLL is assumed to be very nearly in a locked condition. The inputs have almost no phase difference between them. From the timing diagram, it can be seen that the output of AND gate 452 (FIG. 4) will be synchronized to $V_{FREF}$ and $V_{COUT}$. Thus, CP 411A will be in a correction cycle during a time period equal to the first four cycles of $V_{FREF}$, the CPs will alternate at the end of the fourth cycle of $V_{FREF}$, and CP 411B will be in a correction cycle for a time period equal to the second four cycles of $V_{FREF}$. It is to be understood that a variety of time periods and techniques for switching between phase detectors could be used. In this example timing diagram, CP 411A causes the voltage $V_{CAZ1}$ on calibration capacitor 412A to decrease over time. Accordingly, a pulse $V_{RN1}$ is generated at the gate of NMOS transistor 474A, which decreases the voltage $V_{CA1}$ on capacitor 475A, and therefore decreases the sink current and increases the source current of CP 411A. During the next correction cycle for CP 411A, it can be seen that the voltage drift of $V_{CAZ1}$ is reduced (i.e., the mismatch error is reduced thereby reducing static phase offset). Similarly, CP 411B causes the voltage $V_{CAZ2}$ on calibration capacitor 412B to increase over time. Accordingly, a pulse $V_{RP2}$ is generated at the gate of PMOS transistor 471B, which increases the voltage $V_{CA2}$ on capacitor 475B, and therefore increases the sink current and decreases the source current of CP 411B. During the next correction cycle for CP 411B, it can be seen that the voltage drift of $V_{CAZ2}$ is reduced (i.e., the mismatch error is reduced thereby reducing static phase offset).

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, while the above embodiments are described using voltage controlled oscillators or delays, it is to be understood that current controlled devices could also be used. Furthermore, digital implementations of the phase detector, filter, oscillator, or delay could also be used. Based on the above disclosure and the following claims, other arrangements, embodiments, implementations and equivalents will be evident to those skilled in the art and may be employed without departing from the spirit and scope of the invention as defined by the claims. The terms and expressions that have been employed here are used to describe the various embodiments and examples. These terms and expressions are not to be construed as excluding equivalents of the features shown and described, or portions thereof, it being recognized that various modifications are possible within the scope of the appended claims.

What is claimed is:

1. A timing loop circuit comprising first and second phase detectors, wherein during a first time period, the first phase detector is coupled in a closed timing loop and the second phase detector is decoupled from the closed timing loop and calibrated, and during a second time period, the second phase detector is coupled in a closed timing loop and the first phase detector is decoupled from the closed timing loop and calibrated and wherein
   the first phase detector includes a first input, a second input, an adjust input, and an output;
   the second phase detector includes a first input, a second input, an adjust input, and an output;
   the circuit further comprising a voltage controlled oscillator having an input coupled to the output of the first phase detector and the output of the second phase detector, and an output coupled to the second input of the first phase detector and the second input of the second phase detector; and
   a mismatch detector having one or more inputs coupled to the output of the first phase detector and the output of the second phase detector, and one or more outputs coupled to the adjust input of the first phase detector and the adjust input of the second phase detector,
   wherein during the first time period, the output of the first phase detector is coupled to the voltage controlled oscillator, the first and second inputs of the second phase detector are coupled to a common input signal, and the output of the second phase detector is coupled to the mismatch detector, and in accordance therewith, the mismatch detector generates a correction signal for adjusting the second chase detector, and during a second time period, the output of the second phase detector is coupled to the voltage controlled oscillator, the first and second inputs of the first phase detector are coupled to a common input signal, and the output of the first phase detector is coupled to the mismatch detector, and in accordance therewith, the mismatch detector generates a correction signal for adjusting the first phase detector.

2. The timing loop of claim 1 wherein the mismatch detector detects a voltage drift at the output of the phase detector that is indicative of the mismatches in the phase detector.

3. A timing loop circuit comprising first and second phase detectors, wherein during a first time period, the first phase detector is coupled in a closed timing loop and the second phase detector is decoupled from the closed timing loop and calibrated, and during a second time period, the second phase detector is coupled in the closed timing loop and the first phase detector is decoupled from the closed timing loop and calibrated, and wherein
   the first phase detector includes a first input, a second input, an adjust input, and an output;
   the second phase detector includes a first input, a second input, an adjust input, and an output;
   the circuit further comprising a voltage controlled delay having a first input coupled to the output of the first phase detector and the output of the second phase detector, a second input coupled to an input signal to be delayed, and an output coupled to the second input of the first phase detector and the second input of the second phase detector; and
   a mismatch detector having one or more inputs coupled to the output of the first phase detector and the output of the second phase detector, and one or more outputs coupled to the adjust input of the first phase detector and the adjust input of the second phase detector,
   wherein during the first time period, the output of the first phase detector is coupled to the voltage controlled delay, the first and second inputs of the second phase detector are coupled to a common input signal, and the output of the second phase detector is coupled to the mismatch detector, and in accordance therewith, the mismatch detector generates a correction signal for adjusting the second phase detector, and during a second time period, the output of the second phase detector is coupled to the voltage controlled delay, the first and second inputs of the first phase detector are coupled to a common input signal, and the output of the first phase detector is coupled to the mismatch detector, and in accordance therewith, the mismatch detector generates a correction signal for adjusting the first phase detector.

4. The timing loop of claim 1 wherein the first and second phase detectors each comprise a phase frequency detector and a charge pump.

5. The timing loop of claim 4 wherein the first and second phase detectors each further include an adjust input, wherein the adjust input of the first phase detector adjusts at least a first current in a first charge pump, and the adjust input of the second phase detector adjusts at least a second current in the second charge pump.

6. The timing loop of claim 1 wherein the mismatch detector comprises a first calibration capacitor coupled to the first phase detector during the second time period, and a second calibration capacitor coupled to the second phase detector during the first time period.

7. The timing loop of claim 1 further comprising a window comparator coupled to an output of the second phase detector during the first time period and coupled to an output of the first phase detector during the second time period.

8. The timing loop of claim 7 further comprising a current pulse generator coupled to an output of the window comparator.

9. The timing loop of claim 1 further comprising a phase detector configuration controller.

10. The timing loop of claim 9 wherein the phase detector configuration controller comprises a counter.

11. The timing loop of claim 10 wherein the phase detector configuration controller further comprises a phase frequency detector.

12. The timing loop of claim 1 wherein the timing loop is a phase locked loop.

13. A timing loop comprising first and second phase detectors alternately configured in a correction loop and a closed timing loop, wherein during a first time period, the first phase detector is configured in the closed timing loop and the second phase detector is configured in the correction loop, and during a second time period, the second phase detector is configured in the closed timing loop and the first phase detector is configured in the correction loop, and wherein the first phase detector is calibrated independently from the second phase detector, and wherein the correction loop comprises a window comparator.

14. The timing loop of claim 13 wherein first and second inputs of the second phase detector are coupled to a common input signal during the first time period, and first and second inputs of the first phase detector are coupled to a common input signal during the second time period.

15. The timing loop of claim 13 wherein the first and second phase detectors each comprise a phase frequency detector and a charge pump.

16. The timing loop of claim 15 wherein the correction loop detects mismatch in the first and second phase detectors and generates a correction signal, wherein the correction signal is coupled to an adjust input of the first phase detector to adjust a first current in a first charge pump during the second time period, and the correction signal is coupled to an adjust input of the second phase detector to adjust a second current in a second charge pump during the first time period.

17. The timing loop of claim 13 wherein the correction loop comprises a first calibration capacitor coupled to the first phase detector during the second time period and a second calibration capacitor coupled to the second phase detector during the first time period.

18. The timing loop of claim 13 wherein the correction loop further comprises a current pulse generator.

19. The timing loop of claim 13 further comprising a counter for controlling the duration of the first and second time periods.

20. The timing loop of claim 19 further comprising a phase frequency detector coupled to an input of the counter.

21. The timing loop of claim 13 wherein the timing loop is a phase locked loop or a delay locked loop.

22. The timing loop of claim 13 wherein the timing loop is configured as a zero delay buffer.

23. A method comprising:
during a first time period,
coupling an output of a first phase detector to a loop filter capacitor to control a timing loop;
calibrating a second phase detector; and
during a second time period,
coupling an output of the second phase detector to the loop filter capacitor to control the timing loop; and
calibrating the first phase detector,
wherein during the first time period, first and second inputs of the second phase detector are coupled to a common input signal, and an output of the second phase detector is coupled to a mismatch detector, and in accordance therewith, the mismatch detector generates a correction signal for adjusting the second phase detector, and during a second time period, first and second inputs of the first phase detector are coupled to a common input signal, and the output of the first phase detector is coupled to the mismatch detector, and in accordance therewith, the mismatch detector generates a correction signal for adjusting the first phase detector.

24. The method of claim 23 wherein the timing loop is a phase locked loop or a delay locked loop.

25. The method of claim 24 wherein the timing loop is configured as a zero delay buffer.

26. The method of claim 23 wherein during the first time period calibrating comprises detecting a voltage drift at the output of the second phase detector, and during the second time period calibrating comprises detecting a voltage drift at the output of the first phase detector.

27. The method of claim 26 wherein during the first time period calibrating further comprises comparing the voltage drift at the output of the second phase detector to at least one reference voltage, and during the second time period calibrating further comprises comparing the voltage drift at the output of the first phase detector to at least one reference voltage.

28. The method of claim 23 wherein the first phase detector comprises a first phase frequency detector and a first charge pump, and the second phase detector comprises a second phase frequency detector and a second charge pump.

29. The method of claim 28 wherein during the first time period calibrating further comprises adjusting a voltage on a gate of a first transistor coupled to one or both of a current source or current sink in the second charge pump, and during the second time period calibrating further comprises adjusting a voltage on a gate of a second transistor coupled to one or both of a current source or current sink in the first charge pump.

30. A timing loop comprising first and second phase detectors and a loop filter capacitor, wherein during a first time period, the first phase detector is coupled in a closed timing loop and the second phase detector is calibrated, and during a second time period, the second phase detector is coupled in a closed timing loop and the first phase detector is calibrated, and wherein during the first time period, an output of the first phase detector is coupled to the loop filter capacitor, first and second inputs of the second phase detector are coupled to a common input signal, and an output of the second phase detector is coupled to a mismatch detector, and in accordance therewith, the mismatch detector generates a correction signal for adjusting the second phase detector, and during a second time period, the output of the second phase detector is coupled to the loop filter capacitor, first and second inputs of the first phase detector are coupled to a common input signal, and the output of the first phase detector is coupled to the mismatch detector, and in accordance therewith, the mismatch detector generates a correction signal for adjusting the first phase detector.

31. The timing loop of claim 30 wherein the first and second time periods comprise a plurality of cycles of a reference signal.

32. The timing loop of claim 30 wherein the mismatch detector comprises a first calibration capacitor coupled to the first phase detector during the second time period, and a second calibration capacitor coupled to the second phase detector during the first time period.

33. The timing loop of claim 32 wherein the first calibration capacitor is selectively coupled to an output of the first phase detector through a first switch, and the second calibration capacitor is selectively coupled to an output of the second phase detector through a second switch.

34. The timing loop of claim 32 further comprising coupling the first and second calibration capacitors to the loop filter capacitor before calibration.

35. The timing loop of claim 30 further comprising a third phase detector for receiving a reference signal and a feedback signal for controlling the first and second time periods.

36. The timing loop of claim 30 further comprising at least one pulse generator coupled betweento the output of the first and second phase detectors for generating error pulses to correct mismatch.

37. The method of claim 23 wherein the first and second time periods comprise a plurality of cycles of a reference signal.

38. The method of claim 23 wherein the first phase detector is calibrated using a first calibration capacitor during the second time period, and wherein the second phase detector is calibrated using a second calibration capacitor during the first time period.

39. The method of claim 23 further comprising selectively coupling a first calibration capacitor to an output of the first phase detector during the second time period, and selectively coupling a second calibration capacitor to an output of the second phase detector during the first time period.

40. The method of claim 39 further comprising coupling the first and second calibration capacitors to the loop filter capacitor before calibration.

41. The method of claim 23 further comprising receiving a reference signal and a feedback signal in a third phase detector for controlling the first and second time periods.

42. The method of claim 23 further comprising detecting the change in voltage at the output of the first or second phase detectors over a plurality of cycles of a reference signal during calibration.

43. The method of claim 23 further comprising comparing a first voltage on the output of the first or second phase detectors to a first voltage having a first value and a second voltage having a second value, and adjusting a current if the first voltage increases above the first value or decreases below the second value.

44. The method of claim 23 further comprising generating error pulses to correct mismatch.

45. The method of claim 23 wherein the mismatch detector comprises one or more calibration capacitors.

46. The timing loop of claim 3 wherein the mismatch detector detects a voltage drift at the output of the phase detector that is indicative of the mismatches in the phase detector.

47. The timing loop of claim 3 wherein the first and second phase detectors each comprise a phase frequency detector and a charge pump.

48. The timing loop of claim 47 wherein the adjust input of the first phase detector adjusts at least a first current in a first charge pump, and the adjust input of the second phase detector adjusts at least a second current in the second charge pump.

49. The timing loop of claim 3 wherein the mismatch detector comprises a first calibration capacitor coupled to the first phase detector during the second time period, and a second calibration capacitor coupled to the second phase detector during the first time period.

50. The timing loop of claim 3 further comprising a window comparator coupled to an output of the second phase detector during the first time period and coupled to an output of the first phase detector during the second time period.

51. The timing loop of claim 50 further comprising a current pulse generator coupled to an output of the window comparator.

52. The timing loop of claim 3 further comprising a phase detector configuration controller.

53. The timing loop of claim 52 wherein the phase detector configuration controller comprises a counter.

54. The timing loop of claim 53 wherein the phase detector configuration controller further comprises a phase frequency detector.

55. The timing loop of claim 3 wherein the timing loop is a delay locked loop.

56. The timing loop of claim 55 wherein the timing loop is configured as a zero delay buffer.

* * * * *